US009255953B2

(12) United States Patent
Robinson

(10) Patent No.: US 9,255,953 B2
(45) Date of Patent: Feb. 9, 2016

(54) SYSTEM AND METHOD FOR ANTENNA PATTERN ESTIMATION

(71) Applicant: SRC, Inc., North Syracuse, NY (US)

(72) Inventor: Michael Robinson, Drexel Hill, PA (US)

(73) Assignee: SRC, Inc., North Syracuse, NY (US)

( * ) Notice: Subject to any disclaimer, the term of this patent is extended or adjusted under 35 U.S.C. 154(b) by 0 days.

(21) Appl. No.: 13/770,291

(22) Filed: Feb. 19, 2013

(65) Prior Publication Data

US 2013/0214971 A1    Aug. 22, 2013

Related U.S. Application Data

(60) Provisional application No. 61/599,633, filed on Feb. 16, 2012.

(51) Int. Cl.
*G01R 29/10* (2006.01)
*H01Q 3/26* (2006.01)

(52) U.S. Cl.
CPC ............. *G01R 29/10* (2013.01); *H01Q 3/267* (2013.01)

(58) Field of Classification Search
USPC .......................................... 342/360; 343/703
IPC ..................... G01R 29/10,29/105; H01Q 3/267
See application file for complete search history.

(56) References Cited

U.S. PATENT DOCUMENTS

| | | | |
|---|---|---|---|
| 5,187,486 A * | 2/1993 | Kolzer ........................ | 342/360 |
| 6,208,287 B1 * | 3/2001 | Sikina et al. ................ | 342/174 |
| 6,249,247 B1 | 6/2001 | Inugai et al. | |
| 6,456,235 B1 | 9/2002 | Utley et al. | |
| 6,529,745 B1 | 3/2003 | Fukagawa et al. | |
| 7,031,719 B2 | 4/2006 | Miyano et al. | |
| 7,154,283 B1 | 12/2006 | Weakley et al. | |
| 7,177,592 B2 | 2/2007 | Jarett | |
| 7,340,277 B2 | 3/2008 | Nakamura | |
| 7,409,227 B2 | 8/2008 | Kobayakawa | |
| 7,516,057 B2 | 4/2009 | Bridgelall | |
| 7,956,806 B2 | 6/2011 | Liu et al. | |
| 2003/0142023 A1 * | 7/2003 | Djuknic ........................ | 343/703 |

(Continued)

FOREIGN PATENT DOCUMENTS

GB    2468912    9/2011

OTHER PUBLICATIONS

Input device. (2006). In High definition: A-Z guide to personal technology. Retrieved from http://search.credoreference.com/content/entry/hmhighdef/input_device/0.*

(Continued)

*Primary Examiner* — Gregory C Issing
*Assistant Examiner* — Fred H Mull
(74) *Attorney, Agent, or Firm* — George R. McGuire; Daniel P. Malley; Bond Schoeneck & King, PLLC

(57) ABSTRACT

The present invention is directed to a system and method for extrapolating antenna radiation patterns from a small number of measurements. The present invention is configured to derive an initial estimate based on design information and compare the initial estimate to far-field measurements. The controller is configured to recursively obtain a final estimate wherein a difference between the far-field measurements and the final estimate is less than a predetermined amount. The final estimate represents an extrapolated mapping of the antenna pattern.

37 Claims, 11 Drawing Sheets

(56) References Cited

U.S. PATENT DOCUMENTS

| | | |
|---|---|---|
| 2006/0055592 A1* | 3/2006 | Leather et al. ............... 342/174 |
| 2009/0146894 A1 | 6/2009 | Drexler et al. |
| 2009/0160706 A1 | 6/2009 | Oh et al. |
| 2010/0248672 A1* | 9/2010 | Orlik et al. ............... 455/277.2 |

OTHER PUBLICATIONS

Output device. (2006). In High definition: A-Z guide to personal technology. Retrieved from http://search.credoreference.com/content/entry/hmhighdef/output_device/0.*

Input device. (2014). In The Hutchinson unabridged encyclopedia with atlas and weather guide. Retrieved from http://search.credoreference.com/content/entry/heliconhe/input_device/0.*

Output device. (2014). In The Hutchinson unabridged encyclopedia with atlas and weather guide. Retrieved from http://search.credoreference.com/content/entry/heliconhe/output_device/0.*

Sensor. (2000). In Collins english dictionary. Retrieved from http://search.credoreference.com/content/entry/hcengdict/sensor/0.*

S.M. Vovk, et al., "Using the Method of Minimum Extension To Extrapolation of Antenna Measurements, Mathematical Methods in Electromagnetic Theory", 2004, 10th International Conference, Sep. 2004, pp. 159-161.

Marco Donald Migliore, et al., 'Far-Field Antenna Pattern Estimation from Near-Field Data Using a Low-Cost Amplitude-ONly Measurement Setup', Instrument and Measurement, IEEE Transaction on, Feb. 2000, vol. 49, Issue 1, pp. 71-76.

KR 10-2004-0055671 A (Education & Research Foundation for Choongnam University) Jun. 26, 2004, See abstract, p. 2, line 47-p. 3, line 13 and figure 1.

International Search Report Form PCT/ISA/210 and Written Opinion of the International Searching Authority Form PCT/ISA237, International Application No. PCT/US2013/026660, pp. 1-8, Dated May 30, 2013.

Migliore et al. "Far-Field Antenna Pattern Estimation from Near-Field Data Using a Low-Cost Amplitude-Only Measurement Setup." IEEE Transactions on Instrumentation and Measurement. Feb. 2000, vol. 49, Issue 1, pp. 71-76.

Gonzalez-Arbesu et al. "Fast far-field antenna pattern determination using infrared thermograms and phase retrieval algorith." Antennas and Propagation Society International Symposium, 2002. IEEE. 2000, vol. 3, Issue 1, pp. 710-713.

Teramoto et al. "Evaluation of the performance of antenna pattern correction under the influence of unknown antenna pattern changes." Geoscience and Remote Sensing Symposium, 1993. IGARSS '93. Better Understanding of Earth Environment., International. Aug. 1993, vol. 4, Issue 1, pp. 1805-1807.

* cited by examiner

TRUE PATTERN

PREDICTED PATTERN

SYSTEM AND METHOD FOR ANTENNA PATTERN ESTIMATION

CROSS-REFERENCE TO RELATED APPLICATIONS

This application claims priority to U.S. Provisional Patent Application Ser. No. 61/599,633 filed on Feb. 16, 2012, the content of which is relied upon and incorporated herein by reference in its entirety, and the benefit of priority under 35 U.S.C. §119(e) is hereby claimed.

BACKGROUND OF THE INVENTION

1. Field of the Invention

The present invention relates generally to antenna measurement systems, and particularly to a system for estimating antenna patterns using far field samples.

2. Technical Background

An antenna is an electrical transducer that converts an electrical signal into a radio frequency (RF) signal, and vice versa. An antenna is used in conjunction with a radio transmitter or radio receiver. For example, when a radio station transmits a signal (e.g., music), the signal is provided to a radio transmitter that amplifies and conditions the signal before providing it to the antenna. The transmitter "excites" that antenna such that the signal is converted or transduced into RF energy that propagates through space. On the receive side, an antenna intercepts some of the RF energy propagating through space and converts that energy into a very small signal that is supplied to the receiver. The receiver amplifies the small signal and conditions it for subsequent use. Thus, every RF system must have an antenna if it is to be functional. Stated differently, a radio broadcast system, television broadcast system, a cell phone, radar, or a Bluetooth device, to name a few, would be inoperable without an antenna.

There a various types of antennas that are commonly used in the art depending on a variety of factors. In general, an antenna typically includes a plurality of "antenna elements" that are configured to convert electrical signals into RF energy, or vice-versa. These "elements" are electrical conductors that are coupled to the receiver (or transmitter) by transmission lines. Stated differently, the antenna elements may be arranged and configured to form various types of antennas such as, e.g., horn antennas, reflective dish antennas (e.g., a parabolic reflector dish), a phased array antenna (i.e., an array of elements that are excited by electrical signals having a variety of phases), and the like.

One reason why a person skilled in the art would select one antenna over another antenna relates to the shape and direction of the radio waves that are emitted by the selected antenna. The shape and direction of the radio waves emitted by the antenna is often referred to as the "antenna pattern." Omnidirectional antennas transmit the RF energy equally in all directions whereas "directional" or "high gain" antennas transmit the RF energy in a particular direction.

There are two primary aspects of an antenna that have to be in working order for the antenna to properly do its job. The first aspect relates to the physical condition of the antenna: the operability and position the antenna elements (e.g., feed elements, reflectors, etc.) have to be correct. In other words, if a part of the antenna is broken, the antenna will not perform correctly. The second aspect relates to the electrical signals that are being supplied to the antenna. The electrical signals must be calibrated such that they properly "excite" the antenna. As before, if the electrical signals are not calibrated properly, the antenna will not work properly.

In order to determine if a given antenna is working properly, antenna engineers typically place the antenna in an anechoic chamber or outdoor far-field range, excite it with the electrical signals, and measure the resultant antenna pattern. Thus, the antenna pattern can be used to determine if either or both of the two aspects (i.e., physical condition of the antenna or electrical excitations) are defective. One of the drawbacks associated with this approach relates to previously installed antennas, or antennas that are "in the field." For the most part, these antennas have to be removed and transported to the proper facility for the aforementioned testing and repair. This result is both costly and inefficient.

In one approach, the recovery of an antenna's excitation from a limited number of pattern measurements and subsequent prediction of additional portions of the pattern has been considered. In this approach, the antenna is scanned in its near field. After careful calibration for mutual coupling effects, near field scanners obtain a very detailed model of the antenna's current distribution. From this current distribution, accurate models of the resulting antenna pattern can be predicted. One disadvantage of the near-field scanning approach is that sophisticated, expensive equipment and careful calibration are required. It should be noted that if the scanner is designed to fit exactly one specific antenna, some equipment complexity can be removed. However, this presents another drawback in that this system must be specifically tailored to the specified antenna. What is needed is an approach that is general enough to handle many different antenna types essentially without modification, can use simple equipment (e.g., such as a field strength measurement meter), and has minimal calibration requirements. The measurements should be taken in the far field so that mutual coupling is substantially eliminated.

In another approach, far-to-near field transformations are used to filter far-field measurements. Because this approach works exclusively with planar antennas, any excitations found to be off of the plane constitute error, and are removed. In essence, this approach manipulates the excitation structure of the antenna under the assumption of a known configuration. The drawback to this approach is that the algorithm is therefore linear. What is needed is a non-linear optimization that allows antenna configurations to vary.

What is needed, therefore, is a system and method for testing, calibrating and repairing an antenna in the field. The needed system and method would be able to estimate or extrapolate the antenna pattern using a relatively small number of far field measurements and provide data that can be used to diagnose the antenna malfunction.

SUMMARY OF THE INVENTION

The present invention addresses the needs described above by providing a system and method for testing, calibrating and repairing an antenna that is in the field. The present invention is general enough to handle many different antenna types essentially without modification, can use simple equipment (e.g., such as a field strength measurement meter), and has minimal calibration requirements. The measurements are taken in the far field so that mutual coupling is substantially eliminated. Accordingly, the system and method of the present invention is configured to estimate the antenna pattern using a relatively small number of far field measurements. The estimation data can then be employed to diagnose the antenna malfunction. The diagnostic information is then used to either repair the antenna in the field (i.e., remedy the physical issues related to antenna performance), calibrate the antenna (i.e., tune the electrical signals that excite the antenna), or both.

As noted above, measuring antenna radiation patterns requires extensive sampling of transmitted or received signals at many angular locations. The cost and inefficiency of scanning a known antenna over the antenna under test was mentioned above. The present invention uses a small number of measurements and exploits a priori knowledge of the antenna's design to solve the "inverse source problem" by estimating the unseen and unmeasured portions of the antenna's radiation pattern. The method of the present invention is robust enough to detect when the antenna's design model is incorrect, yet general enough to treat many different popular classes of antennas without essential changes.

Although the inverse source problem is unsolvable in full generality, it is solvable if the configurations of radiating and passive structures are known to be constrained. In particular, a solution of the inverse source problem would infer a volumetric current distribution from extensive pattern measurements. Both current distributions and radiation patterns are described by infinite dimensional vector spaces and this leads to nonuniqueness. The design spaces proposed by the present invention have the distinct advantage in that they are finite dimensional descriptions of possible antennas, and therefore convert the inverse source problem to a highly over-constrained problem. Since the radiation pattern of an antenna varies smoothly as its design is adjusted, the celebrated Whitney embedding theorem applies, and indicates that the inverse source problem in this restricted setting is solvable. Further, it yields bounds on the number of samples one must take from the radiation pattern in order to solve for the antenna's design in general.

Inspired by this general theoretical result, the present invention describes a system and method that exploits the measurements taken of an antenna and its associated radiation pattern in order to estimate the pattern at arbitrary directions. In doing so, the present invention carefully treats the problem of symmetries that arise both in the antenna's configuration and in the structure of the measurement sample locations. If unchecked, symmetric sampling methods can result in ambiguities in the radiation pattern estimates, but these ambiguities are generally easy to avoid.

Unlike the various approaches previously discussed, the present invention is substantially more general. In contrast to the linear near-to-far field transformations used as a basis in most antenna measurement techniques, the present invention can accommodate nonlinearities and is insensitive to the type of antenna and associated measurement campaign because it is borne of a differential topological treatment of the problem. Because the algorithms of the present invention are based on this topological theory of radiation patterns, the invention is thus flexible enough to handle any kind of antenna, and merely requires a pattern computation model and a representation of the antenna design space. Moreover, the algorithms of the present invention demonstrate good performance on a wide variety of interesting antennas, rather than being effective only on a particular kind of antenna. Although the examples provided herein are frame from the point of view of far-field, scalar measurements, this is by no means necessary. Indeed, the method of the present invention accommodates polarization-sensitive measurements and near-field scanning as special cases.

One aspect of the present invention is directed to a system that includes a plurality of sensors configured to obtain far-field measurements of an electromagnetic field established by a radiating antenna. The far-field measurements provide a subsampling of the antenna pattern corresponding to the electromagnetic field. At least one device is configured to provide design information substantially corresponding to the antenna. The design information includes physical configuration data and electrical excitation data. A controller is coupled to the plurality of sensors and the at least one device. The controller is configured derive an initial estimate based on the design information and compare the initial estimate to the far-field measurements. The controller is further configured to recursively obtain a final estimate wherein a difference between the far-field measurements and the final estimate is less than a predetermined amount. The final estimate represents an extrapolated mapping of the antenna pattern. At least one output device is coupled to the controller, the at least one output device being configured to perform an antenna related action based on the final estimate.

In another aspect, the present invention is directed to a method including obtaining far-field measurements of an electromagnetic field established by a radiating antenna, the far-field measurements providing a subsampling of an antenna pattern corresponding to the electromagnetic field. Design information corresponding to the antenna is provided, the design information including physical configuration data and electrical excitation data. An initial estimate based on the design information is derived. The initial estimate is compared to the far-field measurements to obtain an initial difference value. A recursive operation is performed if the initial estimate is greater than a minimum value. The recursive operation compares the far-field measurements to subsequent estimates until a final estimate is obtained such that a comparison of the far-field measurements and the final estimate yields a final difference value that is less than the minimum value. The final estimate represents an extrapolated mapping of the antenna pattern. At least one output device is provided and configured to perform an antenna related action based on the final estimate.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention and together with the description serve to explain the principles and operation of the invention.

DETAILED DESCRIPTION

Figure 4:
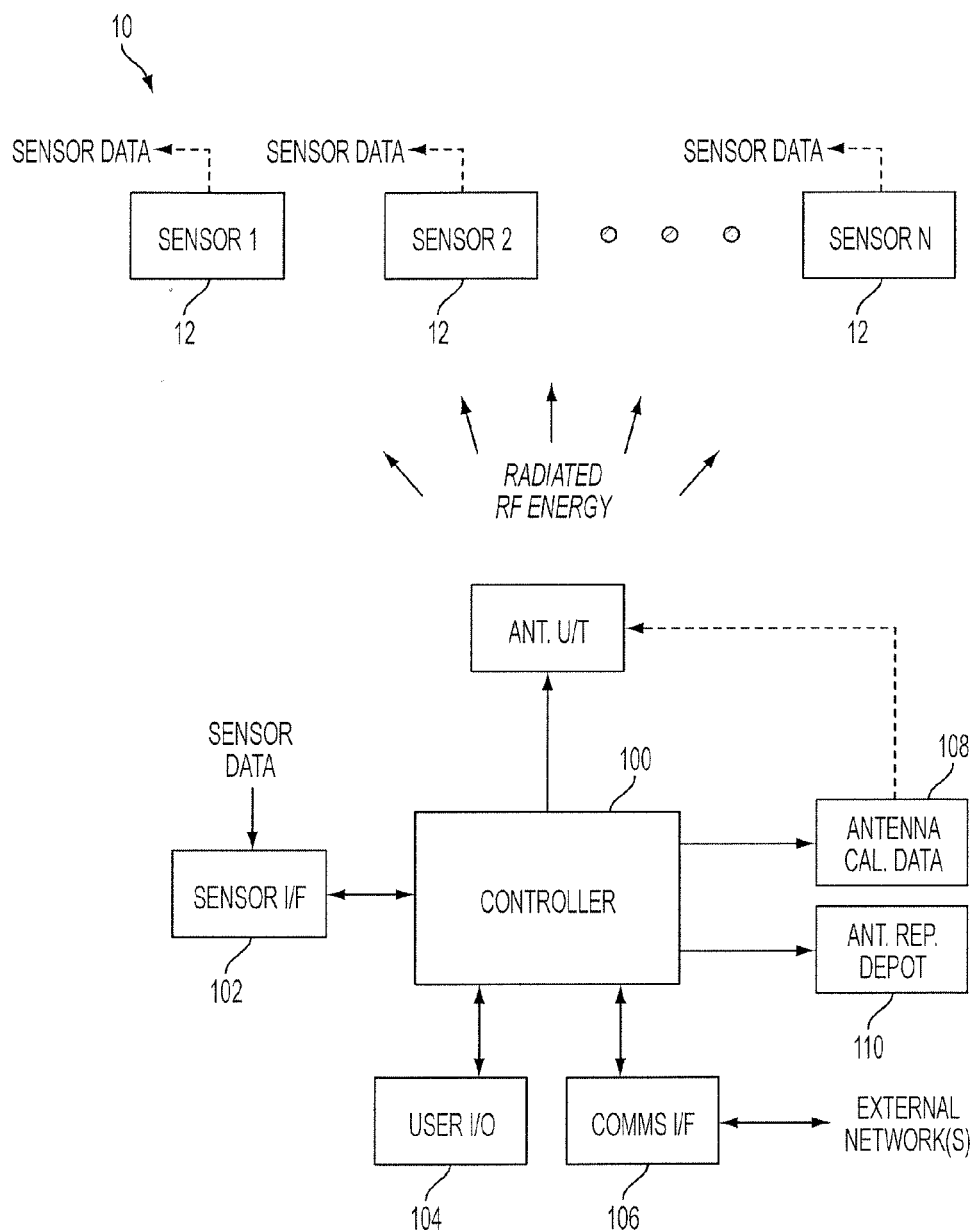
FIG. 4 is a block diagram of a system in accordance with one embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the system of the present invention is shown in FIG. 4, and is designated generally throughout by reference numeral 10.

Before describing the system and method of the present invention, the general theory that permits extrapolation of antenna patterns is developed herein. The approach of the present invention relies on the fact that when enough pattern measurements are taken, the radiating structure of the antenna is completely constrained. Given this radiating structure, we can extrapolate the directivity at any location. Of course, a crucial point is that it takes finitely many parameters to specify a particular antenna in a class of possible designs.

Formally speaking, a design space D is a product C×E of a finite dimensional manifold C (possibly with boundary) called the configuration and a vector space of complex N-tuples $E=C^N$, the excitation. Putting the mathematical formalism aside for a moment, the term "configuration" defines the parameters of an antenna's design. In other words, this is the information required by a person having ordinary skill in the art to build the antenna. Knowing the antenna's configuration provides, for example, information such as the type of antenna being fabricated (e.g., horn, dish, array, etc.), the number of antenna elements and their location, the locations of reflectors, type of grounding, etc. The excitation, on the other hand, tells the person of ordinary skill in the art how the antenna is to be electrically wired or connected. Moreover, the excitation information also provides the relative magnitudes and phases applied to each active element (or feed port) of the antenna, etc.

The following section provides some typical examples of antenna designs and their associated design spaces. A general antenna array with N elements (location of each, overlapping elements are permitted) can be characterized by the following equation:

$$C=R^{3N}, \text{ and } E=C^N$$

The configuration C is nothing more than a list of real numbers having 3N elements, with each of the N antenna element locations being specified by components in three (3) dimensions. The excitation (E) term includes a list of complex numbers C, having N elements.

Figure 1:
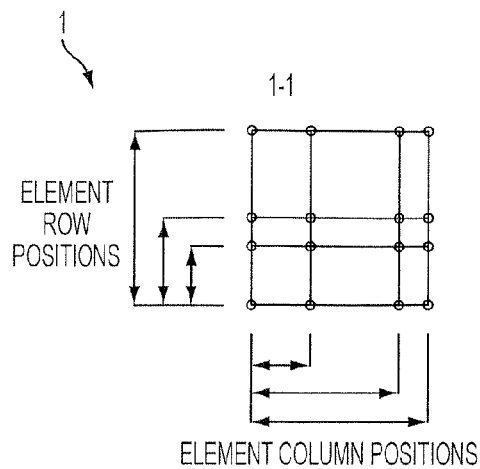
FIG. 1 is a schematic view of a configuration space for a rectangular antenna array.

Referring to FIG. 1, a schematic view of a configuration space for a rectangular antenna array is disclosed. The rectangular array can be characterized by the following equations:

$$C=R^{M+N-2}, \text{ and } E=C^{MN}$$

The list of real numbers R indicates that there are M rows of elements, M−1 row spacings, N columns, and N−1 column spacings. The number of electrical excitations required by the antenna is the number of elements in the array, i.e., product of the number of rows and columns.

Figure 2:
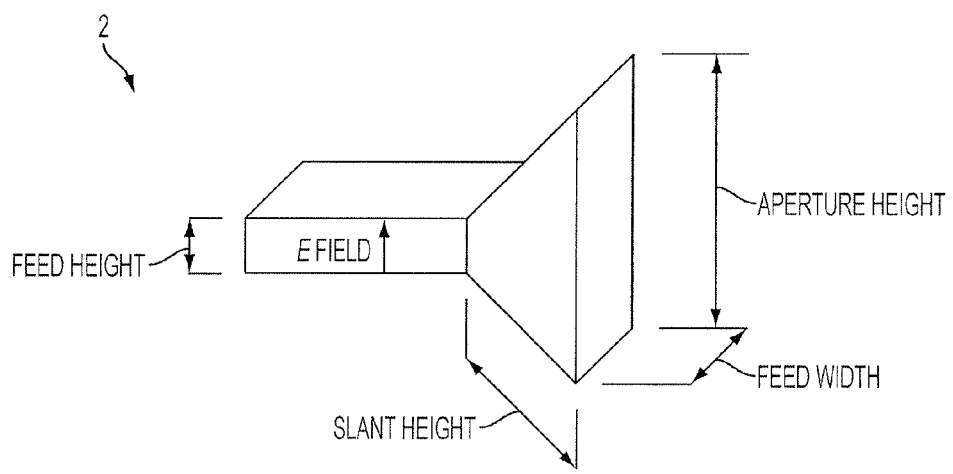
FIG. 2 is a schematic view of a configuration space for an E-plane horn antenna.

In reference to FIG. 2, a schematic view of a configuration space for an E-plane horn antenna is disclosed. The horn antenna can be characterized as follows:

$$C=R^3, \text{ and } E=C$$

Here, the list of real numbers (R) specifying the configuration C includes three elements that correspond to the slant height, the feed width and the aperture height. Since the horn antenna requires only one excitation, there is only one complex number that is required to specify the excitation of the antenna.

Figure 3:
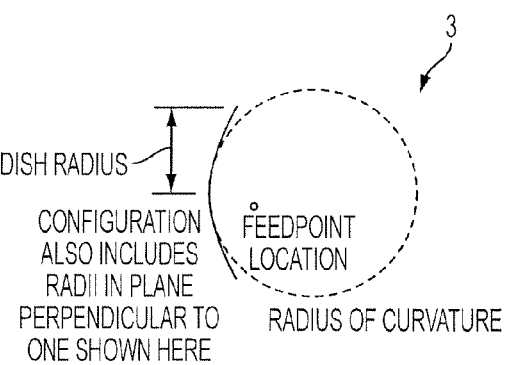
FIG. 3 is a schematic view of a configuration space for an isotropic-fed parabolic dish antenna.

In reference to FIG. 3, a schematic view of a configuration space for an isotropic-fed parabolic dish antenna is disclosed. This drawing provides a planar slice of the antenna that shows a fixed feed and an elliptical dish cut from a paraboloid. The equations characterizing the antenna are:

$$C=R^2 \times R^2 \times R^2 \times SO(3); \text{ and}$$

$$E=C$$

Here, the full configuration C includes the perpendicular radius (first term) and curvature (second term), as well as orientation of feed (x, y, z coordinates of the feed). The term SO(3) is the group of orthogonal 3×3 matrices with unit determinant, and also the group of rotations in 3 dimensions, which specified the feed orientation. Like the horn antenna, the dish antenna requires one excitation because it has only one feed.

One focus of the present invention is directed to estimating or extrapolating the antenna's pattern, which may be thought of as a smooth map F that associates the design space D to a space of measurements M. Using an analogy, F is like a function wherein the space of measurements M is like the independent variable and the design space D is like the independent variable. The space of measurements M is a Banach space of V-valued functions on the unit sphere; this is a much larger space than necessary, but reflects the practice of taking measurements at every possible angle. We assume that V is a C-vector space that describes the polarization response in the far field. We assume that F is linear on the E (excitation) factor, and may be (usually is) nonlinear on C. Generally speaking, V can be more or less informative depending on the kind of pattern under study:

V=R for a magnitude only pattern;

V=C for a pattern in magnitude and phase; and $V=C^3$ for a fully-polarized response in the near field.

(It is $C^2$ in the far-field, since the electric field is transverse to the propagation direction).

Of course, F is a theoretical construct only, in practice one takes measurements of the pattern at finitely many directions $\{\emptyset i\}_{i=1}^{K}$ on the unit sphere. In this case, the full pattern F restricts to the sampled antenna pattern $P:D \rightarrow V^K$. Note also that the model does not explicitly incorporate any physical model of propagation, mutual coupling, or excitation. Because the approach used by the present invention is topological, it is insensitive to any physics beyond what is described above. The description of the algorithm of the present invention (See FIG. 5) will clearly show that the critical resource for extrapolating patterns is the dimension of the number of sample points K versus the dimension of D.

Many diagnostic scenarios require knowledge of the in situ radiation pattern of an antenna system. Unlike a laboratory or other controlled environment, an actively-used antenna system's radiation pattern includes the effects of nearby conductive objects and the ground. These effects are difficult to model accurately, especially if the antenna system is not cooperating with the measurement campaign. However, scanning the entire radiation pattern at all azimuth and elevation angles of an actively-used, non-cooperative antenna is impractical. Typically, sensors mounted on aircraft are flown past the antenna to take measurements at precise, known locations. The present invention remedies this situation by allowing measurements to be taken at whatever locations happen to be convenient. And, as noted herein, these field measurements are transformed into accurate predictions of the radiation pattern at all azimuth and elevation angles, including those that were not directly measured. These predictions are essential for verifying antenna performance but are currently unavailable in the state of the art without costly direct measurement.

One application of the present invention is to measure a portable radar antenna in the field. Because antennas can be damaged in the field, and often are, it is important to deploy a compact system, such as the one shown in FIG. 4, to effect repair and recalibration without removal of the antenna. After an antenna system is disassembled in the field and the damaged parts are replaced, the various components of the radar must be calibrated to one another in order to ensure that the radar's scanning beam is properly focused. Recalibration requires accurate measurement of the radiation pattern at many known, carefully constrained locations to ensure correct operation of the antenna. While the current state of the art almost always requires that the antenna calibration be performed in an anechoic chamber, the present invention does not. Instead, the present invention allows this process to be simplified by removing the constraints on the location where measurements are taken, and dramatically reduces the number of measurements that must be taken. Again, the present invention uses a small number of field strength measurements (as are usually performed in antenna calibration), and transforms these into accurate predictions of the antenna's radiation pattern at all directions. With this accurate antenna pattern, the radar operator can verify that the correct beam is formed and the antenna is operating correctly.

As embodied herein, and depicted in FIG. 4, a block diagram of a system 10 in accordance with one embodiment of the present invention is disclosed. System 10 implements a tool for antenna pattern extrapolation (TAPE) in response to the needs articulated above. The system 10 shown in FIG. 4 is configured as an embedded processor system that can be deployed in the field on an as-needed basis. The system transforms a relatively small number of far field strength measurements of antenna's radiation pattern into an accurate model of the antenna pattern. In another words, the estimated pattern provides estimated data in directions where no direct measurements were taken. In addition to the pattern measurements, it takes user-supplied, qualitative a priori knowledge about the antenna's construction as input.

System 10 includes a controller 100 that is coupled to user input/output (I/O) device(s) 104. The input device(s) allow a user to provide the controller with the á priori knowledge of the system design space D, including the configuration (C) and excitations (E) data described above. The user I/O devices 104 may include display devices that can be used by system operators or other such users. The controller 100 can also be coupled to communication interface(s) 106 that couple the system 10 to one or more external networks such that data, processor instructions, or real time data may be transferred between the system 10 and remote locations.

The system 10 also includes a plurality of sensor devices 12 disposed in the far field of the antenna under-test (Ant. U/T). The number and locations of the field measurement sensors 12 are described below in the text associated with FIGS. 7A-7B. During operation, the antenna under-test will radiate RF energy in response to the electrical excitation signals provided by the controller 100. The sensors 12 provide field measurement data (i.e., sensor data) to the sensor interface 102 via any suitable communications link (wireless, wireline, field wire, etc.). The sensor interface 102 provides the sensor data to the controller 100 in a format that is suitable for the processor (e.g., demodulate RF signals provided by the sensors 12, perform ADC, etc.). Using the algorithm described below (See text associated with FIG. 5), the controller is configured to determine the actual configuration (C) and excitations (E) of the antenna under-test based on the field measurements obtained from the sensors 12.

The controller 100 may also be coupled to an antenna calibration unit 108 and an antenna repair depot 110. After performing the antenna pattern extrapolation, the controller will have derived data corresponding to the difference between the actual configuration C data and the proper C data, and the differences between the actual excitation E values and the proper E data. The excitation E data allows the calibration unit 108 or calibration engineering personnel to calibrate the antenna under-test. Moreover, the configuration C data may be informative with respect to the working condition of the antenna. In other words, the information obtained by performing the algorithm of the present invention may be employed to identify antenna parts or sub-systems that are malfunctioning and in need of replacement or repair.

Stated differently, the C data may be employed by the controller, or a remote processor, to derive antenna diagnostic data in order to notify the test operator to obtain more antenna measurements. The diagnostic data may be used to specify an antenna repair action, an antenna component replacement action or merely provide the user with a display of the extrapolated mapping. The controller can provide the antenna diagnostic data to any number of devices, either connected to the controller or disposed in a remote location via an external network. Thus, the diagnostic data can be provided to a display device, a printing device, a mobile telephone device, a hand-held digital assistant device, a network element, an application or a server.

It will be apparent to those of ordinary skill in the pertinent art that modifications and variations can be made to controller 100 of the present invention depending on the number of tasks the controller is programmed to perform. Once the processor specification is determined, the sizing and selection of the processor components used to implement the controller is well within the skill of a person having ordinary skill in the art. For example, the controller 100 may be implemented to include one or more processors coupled to an address, data and control bus to direct data, instructions and other control information as appropriate. The controller 100 may include various kinds of computer readable media used for storing the information and instructions that are executed by the processor(s). The computer readable media can also be used for storing temporary variables or other intermediate information during execution of instructions by the controller 100. Computer readable media may also be used to store static information and instructions for the processor. According to this embodiment of the invention, the processes of the present invention are performed by the controller in response to the execution of an arrangement of programmed instructions. One or more processors in a multi-processing arrangement may also be employed to execute the instructions contained in system memory.

In alternative embodiments, hard-wired circuitry including gate array devices and application specific devices may be used in place of, or in combination with, software instructions to implement the present invention or certain aspects of the invention. Thus, embodiments of the present invention are not limited to any specific combination of hardware circuitry and software.

The user I/O devices 104 may be implemented using any suitable device or combination of devices. For example, a graphical user interface may be provided to display information to an operator. Information may be displayed using any suitable device including liquid crystal displays, a cathode ray tubes (CRT), active matrix displays, plasma displays, etc. User displays may also include audio components as well. The user I/O device(s) 104 may further include an input device for communicating information and command selections to the controller 100. The input device may be a keyboard that has alphanumeric and other keys, or a cursor control device, such as a mouse, a trackball, or cursor direction keys, for communicating direction information and command selections to the processor circuitry (and for controlling cursor movement on the display).

The communication interface 106, as noted above, may be used to couple the controller 100 to an external network such as a local area network (LAN) or a wide area network (WAN). Wireline or wireless links can be employed herein. In any such implementation, the communication interface 106 is configured to send and receive electrical, electromagnetic, or optical signals that carry digital data streams representing various types of information. The communication interface may be implemented using a fiber optic modem, a wireless interface, a digital subscriber line (DSL) card or modem, an integrated services digital network (ISDN) card, a cable modem, a telephone modem, or any other communication interface to provide a data communication connection to a corresponding type of communication medium. The interface 106 may also be employed to provide the controller 100 with data, including programming code, through the aforementioned network(s). With respect to the Internet, a server (not shown) might be employed to remotely monitor and operate the system 10, or remotely program or revise the programming resident in the controller 100 or the controller memory.

Further, the communications interface circuitry 106 may be equipped with peripheral interface devices, such as a Universal Serial Bus (USB) interface, a PCMCIA (Personal Computer Memory Card International Association) interface, etc. Although a single interface 106 is depicted in FIG. 4, multiple communication interfaces can also be employed within the scope of the present invention.

The term "computer-readable medium" as used herein refers to any medium that participates in providing data and/or instructions to the processor for execution. Such a medium may take many forms, including but not limited to non-volatile media, volatile media, and/or transmission media. Common forms of computer-readable media include, for example, various types of RAM, ROM (PROM, EPROM, EEPROM, etc.) FLASH-EPROM, any other memory chip or cartridge, a carrier wave, or any other medium from which a computer can read. Various types of optical and magnetic disks are known to be employed as computer-readable media. Thus, the present invention may employ a floppy or flexible disk, a hard disk, a magnetic tape, a CD-ROM, CDRW, DVD, USB device, punch cards, paper tape, optical mark sheets, and any other physical medium with patterns of holes or other optically recognizable indicia, or any other electrical, magnetic or optical medium. Transmission media include coaxial cables, copper wire, or fiber optics. Transmission media can also take the form of acoustic, optical, or electromagnetic waves, such as those generated during radio frequency (RF) and infrared (IR) data communications.

With the aforementioned in mind, a person skilled in the art will appreciate that the I/O, communication and some processing functionality may be implemented in locations that are proximate to, or remote from, the system 10 of the present invention.

Figure 5:
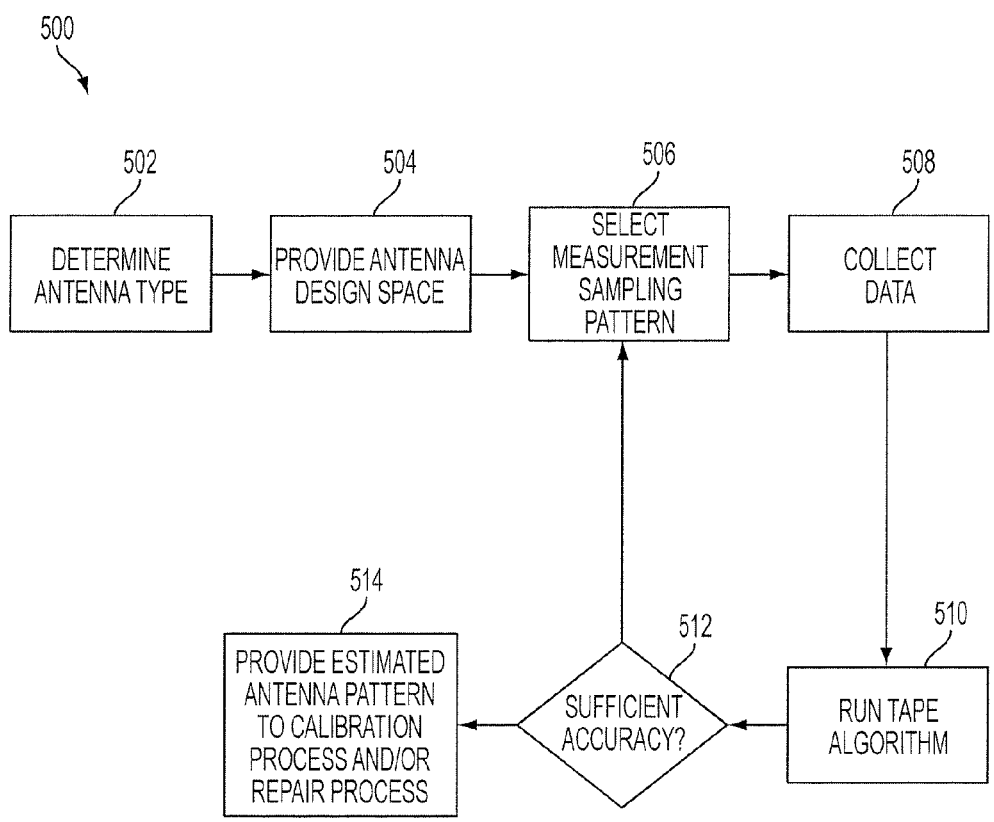
FIG. 5 is a flow chart illustrating a method for providing estimated antenna pattern data in accordance with an embodiment of the present invention.

As embodied herein, and depicted in FIG. 5, a flow chart 500 illustrating a method for providing estimated antenna pattern data in accordance with an embodiment of the present invention is disclosed. Briefly, in step 502, the user determines what type of antenna is being tested or measured. Based on this information, the design space (D=C×E) is provided or input to controller 100 in step 504. Next, the users or test operators select the measurement sampling pattern. See, e.g., FIGS. 7A-7B for example sampling patterns. In step 508, the controller 100 provides the antenna under test with excitations such that the antenna radiates RF energy, and the sensors 12 take far field measurements. The sensor data is then provided to the controller 100 which runs the TAPE (Tool for Antenna Pattern Extrapolation) algorithm described in great detail below. In step 512, the TAPE algorithm determines whether the measured data has provided enough accuracy. If the answer is no, the controller 100 is programmed to obtain more field measurement samples by repeating steps 506-510. Once the controller 100 determines that the antenna pattern can be estimated with sufficient accuracy, step 514 provides an extrapolation or estimate of the antenna pattern that is actually propagating in the far field. As explained below, the pattern extrapolation data is expressed in terms of two variables (x, a) that correspond to the antenna configuration C and the antenna excitation E. As noted previously, the C data can be used to determine the antenna's physical condition (e.g., component repair or replacement information) whereas the E data can be employed to obtain antenna's electrical state (e.g., actual wiring or excitation pulse information).

Having a provided a brief overview of the method of the present invention, a more formal description is provided herein. This section describes an algorithm that estimates the pattern at a desired set of locations, given knowledge of the pattern at other locations and the general configuration of the antenna. The algorithm proceeds in two stages: (I) prediction of the antenna design from the measurements, and (II) prediction of the pattern based on the predicted design.

As noted above, F was defined as a smooth map that associates the design space D to a space of measurements M. It is crucial that F depend linearly on the excitation E in order for the algorithm to succeed. The user is given the responsibility of defining this prediction function. Therefore, stage (I) is defined in great detail here. As described above, the design of the antenna is parameterized by a choice in D=C×E. In the implementation of the present invention, the assumption is that $C=R^p$ and $E=C^q$, even though some of the cases shown above are parameterized by manifolds.

Stage (I) of the algorithm takes as input signal measurements at each sample point, summarized as a vector $p \in V^K$. The signal measurements, of course, are an implementation of the pattern computation function P. Observe that since F is linear in the excitations, P is implemented as a K×q matrix function P=P(x) which depends on x∈C. This definition implicitly requires knowledge of the locations $\{\emptyset i\}_{i=1}^{K}$ of the sample points.

Stage (I) output generates an estimate of the configuration and excitation of the antenna as a point in C×E. The algorithm proceeds recursively, starting with an initial guess $(x_0, a_0)$ ∈C×E supplied randomly or from the user. For example, one initial guess might be the design specification of a properly configured and excited antenna.

The TAPE algorithm is provided below and is shown to produce a sequence $(x_n, a_n)$ from the initial guesses $(x_0, a_0)$. The initial values are compared to the measurements, and as shown in steps 506-512, the guess are refined and modified until the variables (x, a) substantially correspond to the measurements:

1) A dense rectangular grid with a fixed number of elements of $\mathcal{C}$ is computed, called $\{x_n^j\}_j$, centered on $x_n$. Specifically, if L points in each dimension are to be computed, $$x_n^{j_1 \cdots j_p} = x_0 + 2^{1-n}((j_1 - L/2)h_1, \ldots, (j_p - L/2)h_p).$$

The $h_i$ determine the spacing between sample points in each dimension, and are chosen by the user based on the expected variability between antennas under test.

2) For each element of $\{x_n^j\}$, the best (in the least squares sense, constrained to unit magnitude) excitation $a_n^j$ associated to the linear problem $\mathcal{P}(x_n^j, a_n^j) = p$ is computed. We do this easily using the matrix representation $\mathcal{P}(x, \bullet) = P(x)$ and the explicit formula $$a_n^j = (P(x_n^j)^* P(x_n^j) + I)^{-1} P(x_n^j)^*$$

for constrained least squares, where the star represents the conjugate transpose operation.

3) The next iterate $(x_{n+1}, a_{n+1})$ is defined to be the choice of $(x_n^j, a_n^j)$ that minimizes $\|\mathcal{P}(x_n^j, a_n^j) - p\|$ in the least-squares sense. Observe that based on the formula above for $a_n^j$, $$\mathcal{P}(x_n^j, a_n^j) = P(x_n^j)(P(x_n^j)^* P(x_n^j) + I)^{-1} P(x_n^j)^*.$$

4) Steps (1)-(3) are repeated until the residual $\|\mathcal{P}(x_n^j, a_n^i) - p\|$ is smaller than a desired amount or a specified number of iterations is reached.

The algorithm of the present invention computes an approximation to $P \bigcirc P^{-1}: P(D)CV^K \to M$, the map which takes a subsampled pattern to one extrapolated to all points. Along the way, it determines the configuration and excitation of the antenna from its pattern. Since D may have a large dimension, and P may have a complicated form, the algorithm exploits the assumed product decomposition D=C×E, and the fact that P depends linearly on the E factor. This has two major benefits: (1) constrained least-squares can be used to robustly recover the component of the solution in E given the solution in C, and (2) the nonlinearity of P is confined to a much lower dimensional factor, namely C.

The obstruction to determining an antenna's design from measurements is lack of injectivity of the pattern P. However, it is a general fact that P is injective when there are enough sample points.

Theorem 1. Suppose that 2 dim $\mathcal{D}$ <K dim V. The set of patterns $\mathcal{P}: \mathcal{D} \to V^k$ for which there exists a smooth extrapolation map $\mathcal{F} \bigcirc (\mathcal{P})^{-1}: \mathcal{P}(\mathcal{D}) \to M$ from a submanifold of $V^K$ to $\mathcal{M}$ is an open and dense subset of the space of smooth functions from $\mathcal{D}$ to $V^K$.

In particular, this map takes a sampled pattern in the image of P to the pattern extended to all possible sample point locations. This map is well defined and smooth for almost every choice of P.

Proof: First, observe that the sampled pattern $P: D \to V^K$ is a topological embedding (hence injective) for all maps in an open and dense subset of $C\infty(D; V^K)$ when 2 dim D<K dim V. This follows immediately from the Whitney embedding theorem for manifolds with boundary, since P is a smooth map. Those skilled in the art will notice that although the invention assumes the smoothness of P (dependence of the pattern on the configuration), in fact, the smoothness of the inverse is obtained.

In essence, this theorem is a statement about the prevalence of ambiguous pattern measurements. An ambiguity arises when two antennas with different designs result in the same pattern measurements. The standard proof of the Whitney embedding theorem (as used above) demonstrates that if an ambiguity arises, the largest dimension it can have is dim D. Therefore, a transverse perturbation will completely resolve the ambiguity if the ambient dimension is at least twice that. This explains why the hypothesis 2 dim D<K dim V of the above stated Theorem is necessary.

It should be noted that the antenna pattern measurement space $V^K$ can be a vector space over C (magnitude and phase) or R (magnitude). In the latter case, it is theoretically immaterial whether the magnitude is given in absolute units such as volts per meter (V/m) or in decibels. (Although the resulting topologies are different as sets, they are equivalent in terms of convergence properties.)

Those skilled in the art are cautioned that density of choices for P is not a completely innocuous result. A simple example of a choice of P for which the conclusion of the Theorem stated above does not hold arises from sampling azimuth patterns only. Specifically, let us consider the case of an array composed of N isotropic radiators located at $\{x_m\}_{m=1}^{N}$ with excitations $\{a_m\}_{m=1}^{N}$ respectively. Consider the pattern map arising from taking sample points at $s_k = (R \cos k\theta, R \sin k\theta, 0)$ (where R, θ are fixed), namely $$P(x_1, \ldots, x_N, a_1, \ldots, a_N)K - \sum_{M=1}^{N} a_m e^{\frac{i\omega\|x_m - s_K\|}{c}}.$$

There is an inherent ambiguity whether a given $x_m$ is above and below the xy-plane. On the other hand, many small vertical perturbations of the sample points will induce a small perturbation of the resulting pattern maps (since exp is smooth), yet will break the symmetry and thereby ensure the existence of an accurate extrapolation map.

Because symmetric (or nearly symmetric) sampling is common in practice, the existence of a extrapolation map could be an inherently delicate phenomenon. In order to validate its robustness in practice, the inventor tested the algorithm using data collected in a laboratory experiment and from extensive simulations.

Figure 6A:
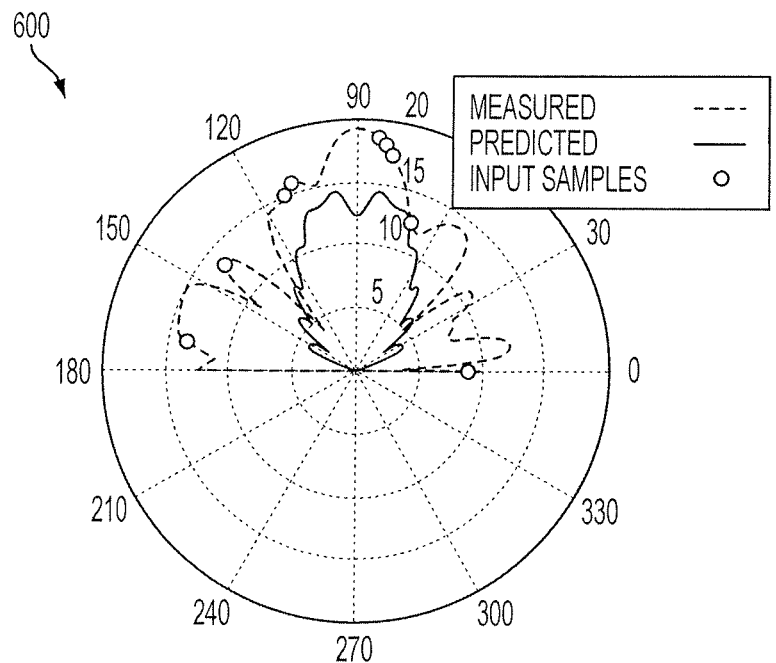
FIGS. 6A and 6B are charts that include measured antenna patterns obtained in accordance with the methods of the present invention, with FIG. 6A indicating incorrect antenna operation and FIG. 6B indicating correct antenna operation.
Figure 6B:
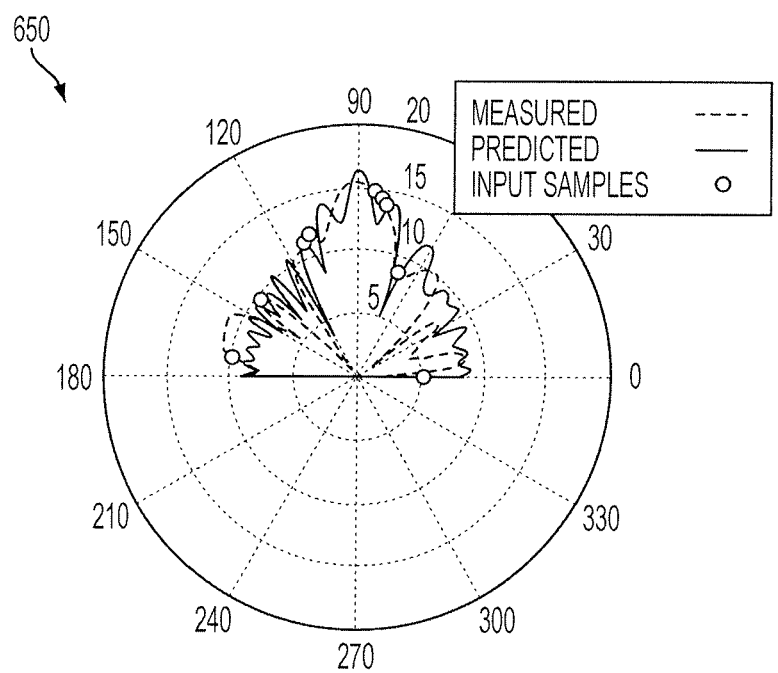

In reference to FIGS. 6A and 6B, charts that include measured antenna patterns obtained in accordance with the methods of the present invention are disclosed. In order to validate the algorithm described above, controlled azimuth pattern data was obtained by mounting a known horn antenna on an azimuth positioner in an anechoic chamber and measuring it at several frequencies. A small subset of these measurements was selected to use as input to the algorithm, and the remainder were used as truth to compare against the extrapolated pattern produced by the TAPE algorithm.

The antenna used in this experiment was an SGA-80 manufactured by Seavey Engineering Associates and is rated at approximately 17 dBi at 7-10 GHz. The mounting hardware was custom made to anchor the antenna to the azimuth positioner. The assembly produces a 180° scan of the pattern, centered on the main beam. The antenna under test and receiver horn (not shown; permanently installed in the anechoic chamber at a range of 10 meters) were fed by a vector network analyzer programmed to collect magnitude and phase at 1° azimuth increments.

The design space for the antenna-pedestal configuration consists of 5 total real degrees of freedom. Of these, 3 dimensions specify the width, height, and length of the horn. The other 2 dimensions specify the x and y coordinates of the pedestal base with respect to the feedpoint of the horn. The height of the pedestal was not parameterized in the model and was estimated to be roughly one meter. Therefore, according to Theorem 1, 10 real degrees of freedom would need to be collected to ensure proper operation of the algorithm. We selected 9 complex sample points (18 real measurements) at random from the 181 sample points collected to use as input to the algorithm. This satisfies the hypotheses of the theorem, provides 1.8 times more measurements than needed, and yet is a relatively small number of measurements. Subsequently, the test was repeated using more sample points as input; the resulting output is similar to what is presented here, though the error levels were lower.

The algorithm used the closed-form expressions for the E-plane horn found in the art to predict the horn's radiation pattern. The algorithm also added a specular component for the horn-pedestal-receiver path with a reflection coefficient of unity to account for multipath. This specular component was optionally disabled to validate the necessity of parameterizing the pedestal.

The experimental procedure validates the performance of the extrapolation algorithm by comparing its output to the (measured or simulated) true pattern. In simulation, the true pattern was computed on a densely sampled pattern at many azimuth and elevation angles from a known configuration. From this densely sampled pattern, a subset of samples to be used as input to the algorithm was selected. The algorithm was then applied to estimate the pattern at each of the original sample points. Although directly computing the differences between the estimated and true values gives a measure of performance, the total error is not very useful in practice, since the true pattern is unavailable.

A more predictive performance measure exploits the fact that the estimated pattern differs from the suppled (sub-sampled) pattern. This pattern residual error/comparison value (between output of the algorithm and the input pattern) should ideally be zero, but due to discretization and numerical errors, it does not vanish. By comparing the residual error and the total error, it becomes possible to predict the performance of the algorithm knowing only the residual error.

The algorithm was executed ten times (with randomly selected initial conditions) for the input points that were selected. The extrapolated patterns with the best residual error are shown in FIGS. 6A-6B with overall performance shown in the Table I.

TABLE I

EXTRAPOLATION PERFORMANCE
ON EXPERIMENTAL DATA

| Antenna Model | Residual Error | Total Error |
|---|---|---|
| No Pedestal | 5.2 dB | 6.0 dB |
| Pedestal Included | 1.8 dB | 2.1 dB |

It is clear that the pedestal model is essential for satisfactory performance, so we conclude that the invention is effective at detecting and diagnosing defective antenna systems. Not only are the measured patterns asymmetric, but without the pedestal an accurate estimate of the main beam gain cannot be obtained. Observe that with the pedestal model, the mainlobe beamwidth is correctly predicted to within a few degrees, and that the sidelobe levels are correctly predicted to about 2 dB. Some of the sidelobe null locations are recovered, though the predicted pattern shows more variation than was measured.

In addition to the experimental validation, the performance of the invention was analyzed using simulated antenna patterns. Antenna types were tested whose design spaces are described above using parameterizations found to be convenient for use in the algorithm. To keep the exposition simpler, idealized models of antennas are treated, ignoring polarization, ground effects, support structures, and dielectrics. The simulations confirm both the theoretical and practical value of the method of the present invention, by showing that the pattern map P is injective in many cases, and can be used to robustly extrapolate to an approximation to F.

Figure 7A:
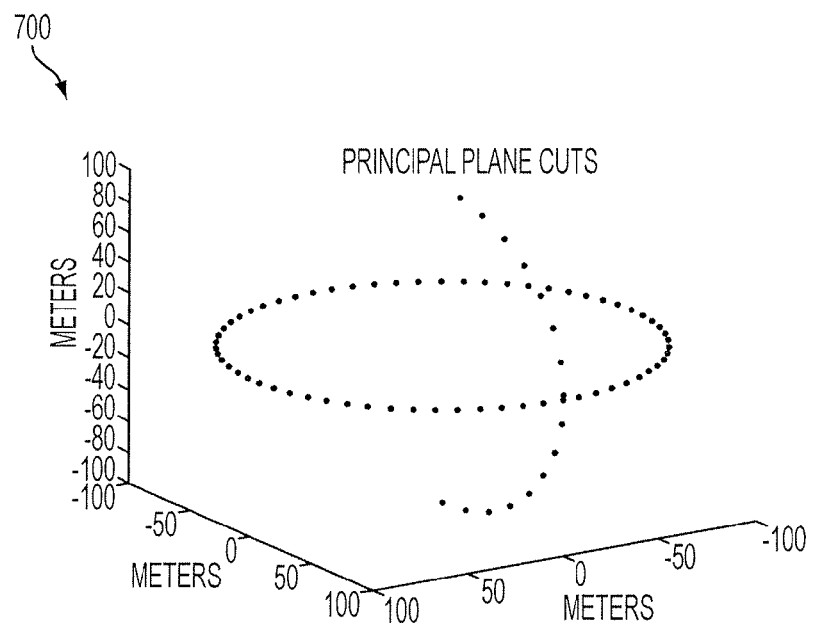
FIGS. 7A and 7B are sampling patterns used to obtain far-field measurement samples in accordance with the present invention.
Figure 7B:
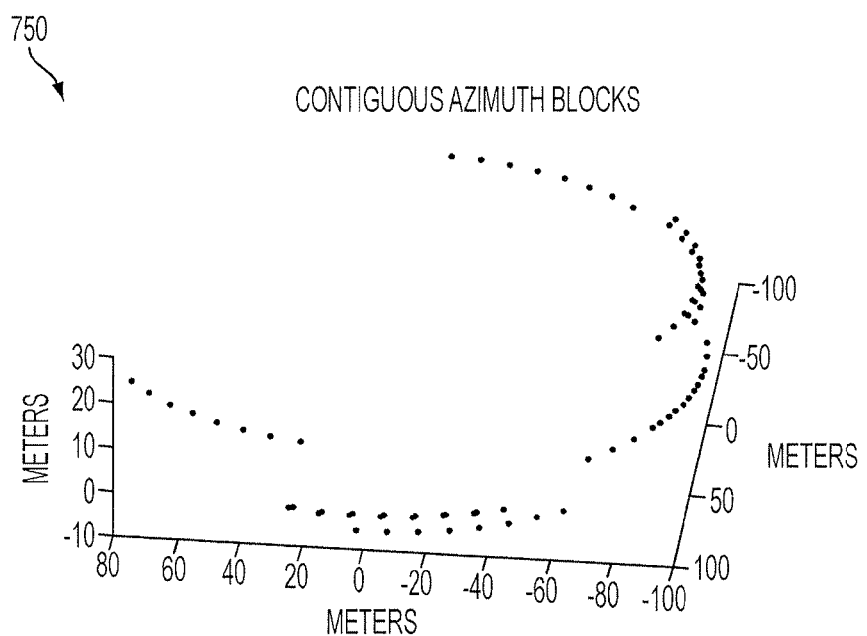

Referring to FIGS. 7A-7B, some of the sample point layouts used in the inventor's simulation are disclosed. The simulation was performed to determine the sensitivity of the algorithm to the choice of sample points. The sample point layouts included azimuth pattern samples only, blocks of contiguous portions of azimuth samples, at random small elevation angles, complete azimuth and elevation patterns together, and random sampling layouts. FIG. 7A shows a layout that features principle plane cuts. FIG. 7B is a sample layout that features contiguous azimuth blocks.

It is worth noting that although azimuth and elevation patterns are considered standard procedure due to the mechanical simplicity of collecting them, they can be suboptimal for the present invention. Specifically, if the azimuth plane or elevation plane is a plane of symmetry for the antenna, ambiguities in F may arise. Therefore, to balance between measurement complexity and the need to break sampling symmetry, the inventor also considered contiguous blocks of azimuth samples at random elevation angles (FIG. 7B). The simulation compared the performance of the present invention by using a large number of typical antennas to uncover the relationship between sampling patterns and the resulting ambiguities.

Figure 8A:
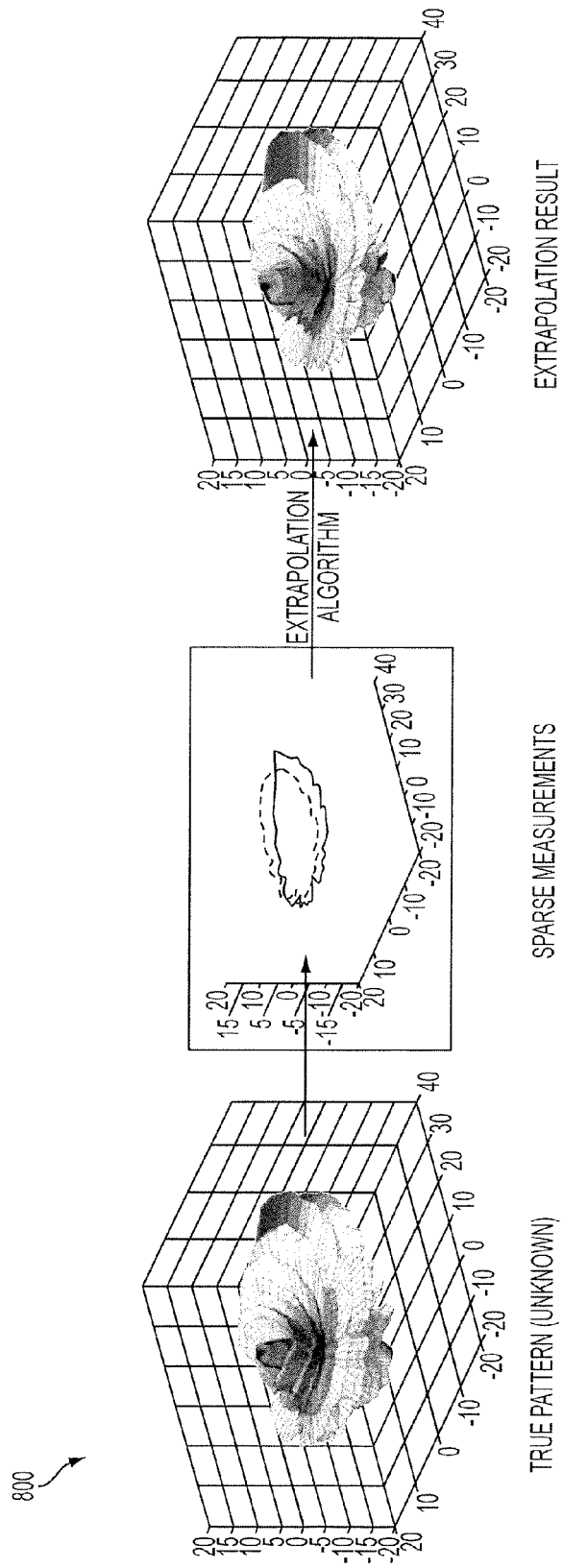
FIGS. 8A and 8B are charts illustrating the performance of the present invention for an E-plane horn antenna.
Figure 8B:
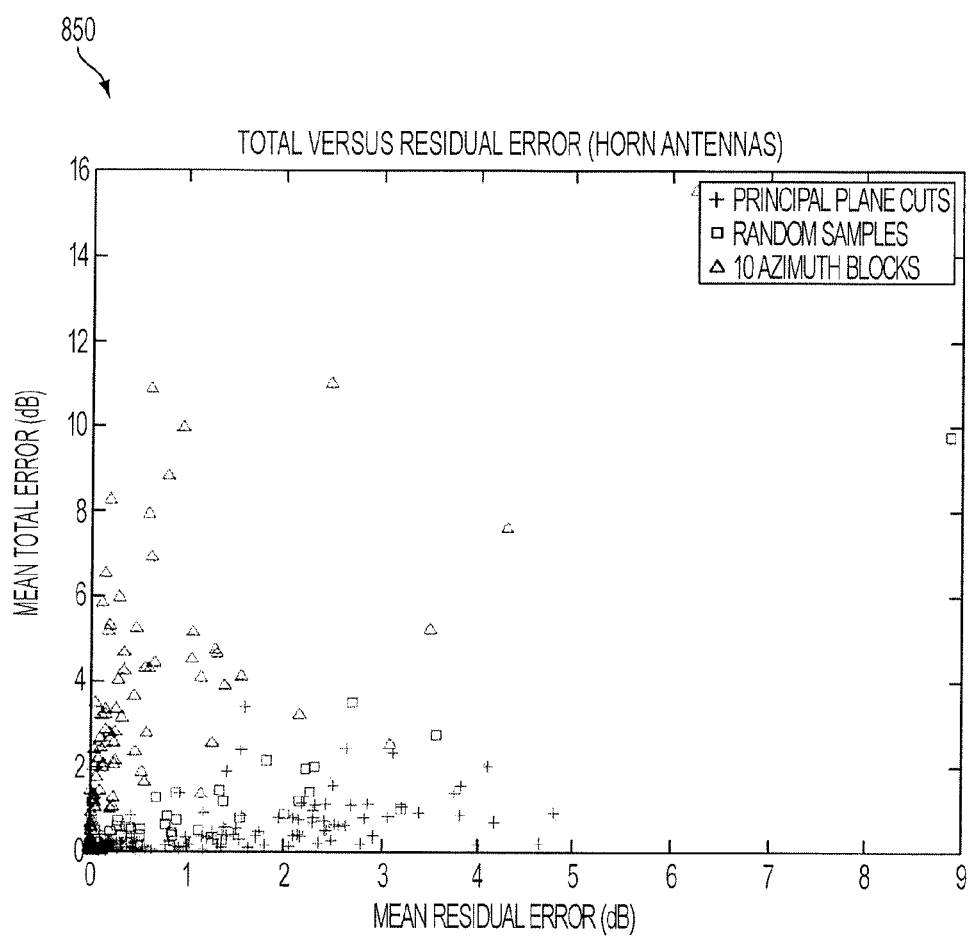
Figure 9A:
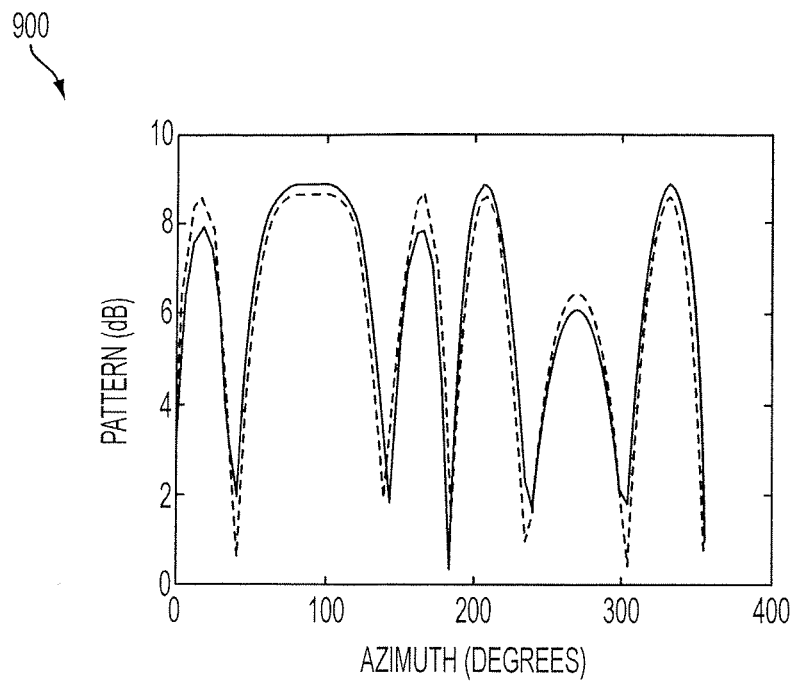
FIGS. 9A-9D are charts comparing the azimuth and elevation patterns of a typical rectangular array with patterns predicted by the present invention.
Figure 9B:
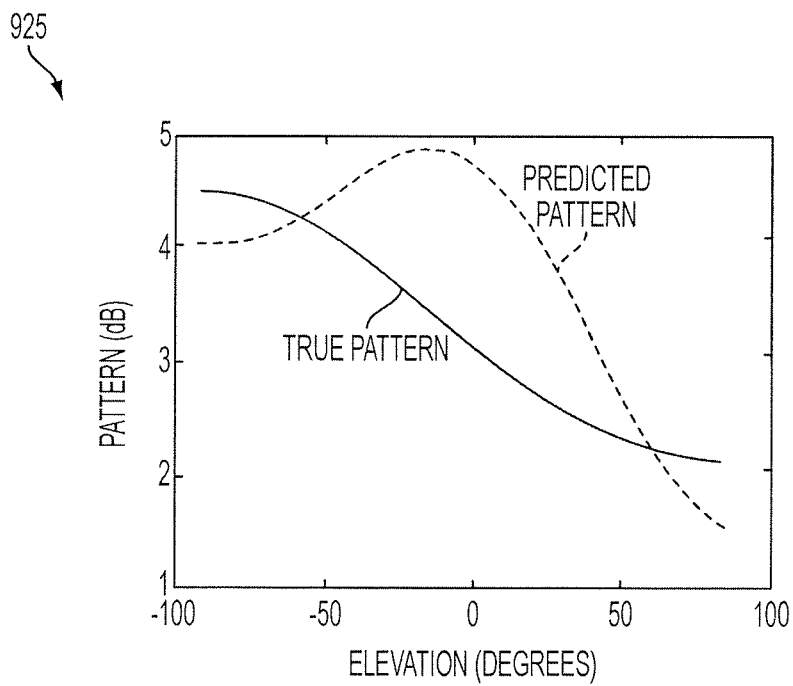
Figure 9C:
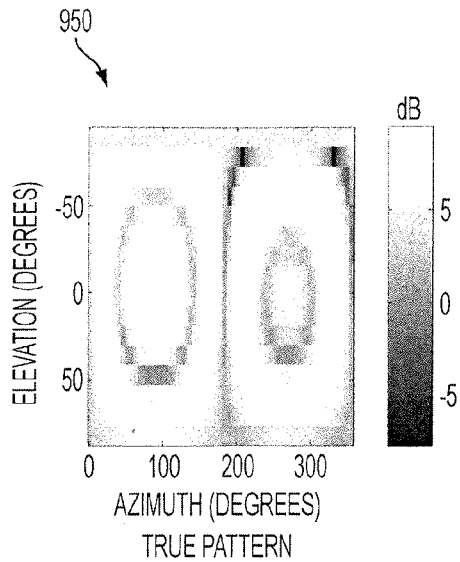
Figure 9D:
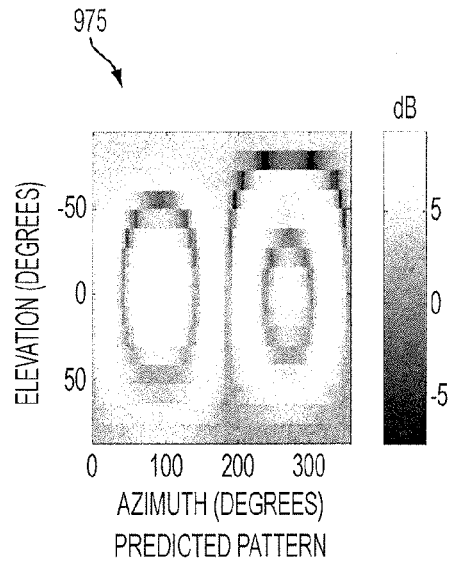

Referring to FIGS. 8A and 8B, charts illustrating the performance of the present invention for an E-plane horn antenna are disclosed. Referring back to FIG. 2, an E-plane horn has three design parameters: the width between parallel plates, the height of the throat of the horn, and the height of the mouth of the horn. Therefore, $C=R^3$. From these parameters, it is straightforward to compute the pattern F of the horn. For the simulation, the closed-form solutions known in the art were used. For this antenna, Theorem 1 indicates that one needs to take at least seven (7) measurements to obtain injective pattern maps P. (The simulated model of horn excludes the pedestal used in our experiment.) A typical result is shown in FIG. 8A, in which two azimuth patterns (middle) were taken from a known antenna (whose pattern appears on the left) and were used by the algorithm to predict the extrapolation shown at right. The sidelobe structure of the predicted and the true patterns is quite similar.

The horns were oriented in the simulations such that the E-field is in the elevation plane. Typical horns with mouth and side length dimensions up to 6 wavelengths were tested. The overall performance of the extrapolation of E-plane horn antennas is shown in FIG. 8B. The simulation tested 100 antennas and the TAPE algorithm required only 10 iterations at most. Accordingly, the algorithm of the present invention works quite well: if the residual error is low, the total error will usually be low as well. However, using contiguous blocks of azimuth samples (with random small elevation angles)

appears to result in some ambiguity, since there is a cluster of points (marked with triangles) along the vertical axis. This means that the algorithm can converge with low residual error, yet result in poor pattern predictions (high total error) when azimuth blocks are used. In this case, the controller (item 100 in FIG. 4) would notify the operator that more measurements should be taken. Since much of the azimuth pattern is supplied to the algorithm in this case, the worst errors occur at high elevation angles. Random sampling (which has the least amount of symmetry) achieves a practical lower bound on total error, and low residual error indicates reliable predictions are made.

In reference to FIGS. 9A-9D, charts that compare the azimuth and elevation patterns of a typical rectangular array with patterns predicted by the present invention are disclosed. As noted above, rectangular arrays have a design space given by $C=R^{M+N+2}$, and $E=C^{NM}$, where there are M rows and N columns of elements. The components of C specify the element spacing, as shown in FIG. 1. In this case, the full pattern map is straightforward to construct, namely $$F(x, y, z)(\emptyset, \theta) = \sum_{j=1}^{M} \sum_{k=1}^{N} a_{jk} e^{i\omega(y_j \sin\theta + x_k \cos\varphi)} \overline{c},$$

where $x_k$ represents the column locations ($x_1=0$ is fixed), $y_j$ represents the row locations ($y_1=0$ is fixed), and the antenna elements lie in the xy-plane.

It is known that the full pattern of a given rectangular array is uniquely determined by its excitations. Those skilled in the art will appreciate that the near-to-far transform ($E \to L^2(S^2, C)$) is a discrete Fourier transform under an appropriate change of variables, and the Fourier transform is invertible. Theorem 1 extends this standard result to treat subsampled patterns, and our algorithm can treat this situation if K measurements are taken, where K>2+2MN.

To validate performance in simulation, we tested our algorithm on small arrays with 3 rows and 3 columns of elements, spaced randomly up to one-half wavelength. Random complex excitations were applied to each element. A typical antenna pattern, its principal plane patterns, and extrapolation results are shown in FIGS. 9A-9D.

Figure 10:
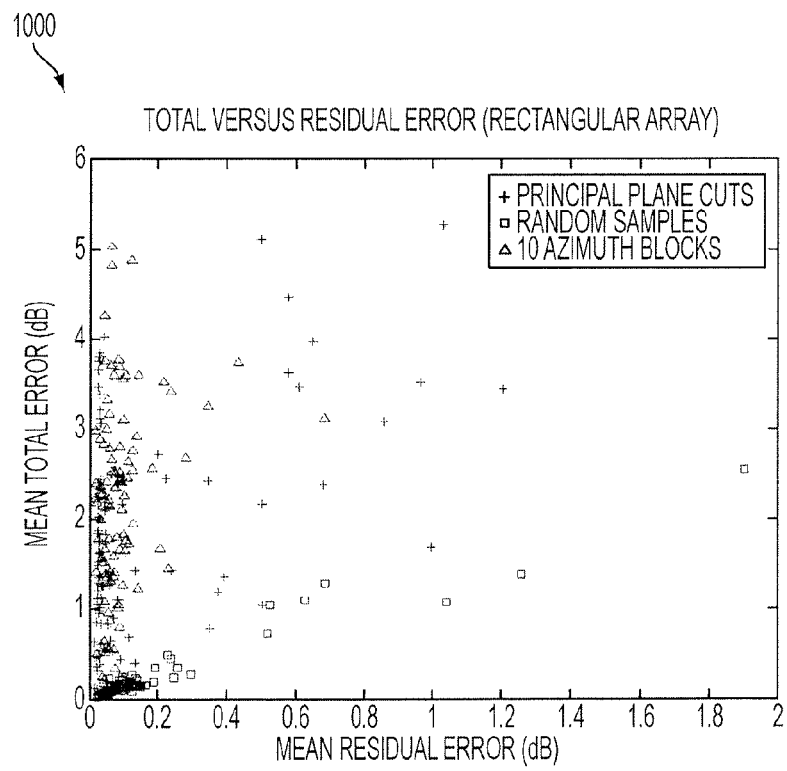
FIG. 10 is a chart illustrating the extrapolation performance for a rectangular antenna array in accordance with the present invention.
Figure 11A:
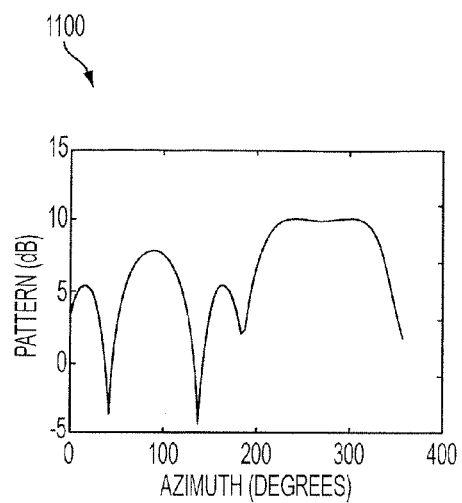
FIGS. 11A-11D are charts illustrating incorrectly predicted off-axis sidelobes for a rectangular array.
Figure 11B:
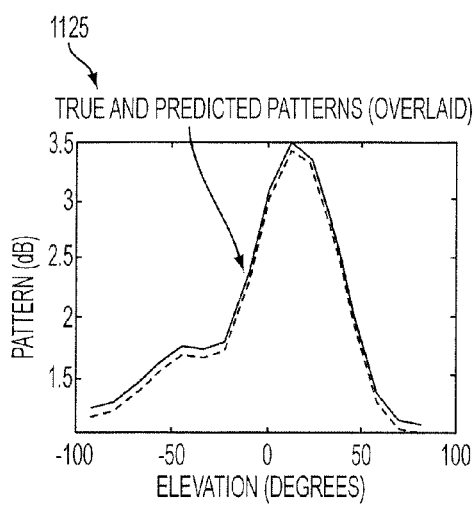
Figure 11C:
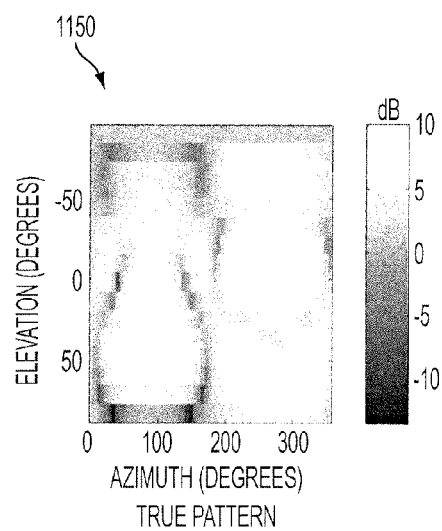
Figure 11D:
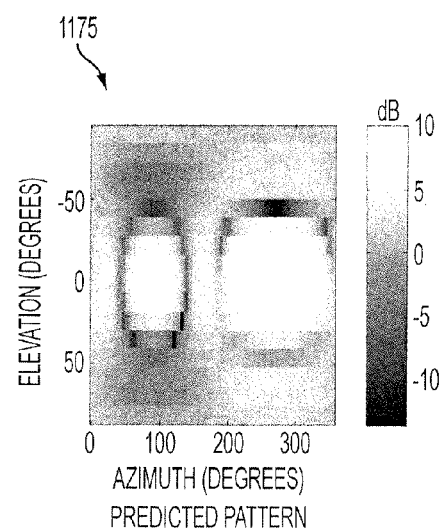

FIG. 10 is a chart illustrating the extrapolation performance for a rectangular antenna array. This plot illustrates the typical performance of the algorithm of the present invention using 10 iterations on 100 sample antennas. Unlike the case of the horn, there is substantial dependency on the sampling pattern. Principal plane patterns do not exhibit a definite reduction in total error, even with essentially no residual errors. This is due to the vertical and horizontal symmetry of the array, which leads to ambiguities in the resulting pattern when sampled in the azimuthal and elevation planes. Clearly, a lower bound on total error is achieved with random sampling.

Referring to FIGS. 11A-11D, charts illustrating incorrectly predicted off-axis sidelobes for a rectangular array are provided for sake of comparison. These plots illustrate the importance of being aware of the effects of symmetrical sampling when selecting collections of sample points. In particular, using strictly azimuth or elevation patterns (or both) can result in mis-estimation of non-cardinal sidelobes as shown in FIGS. 11A-11D. These sidelobe mis-estimations are the cause of the large total errors shown in these Figures.

Figure 12:
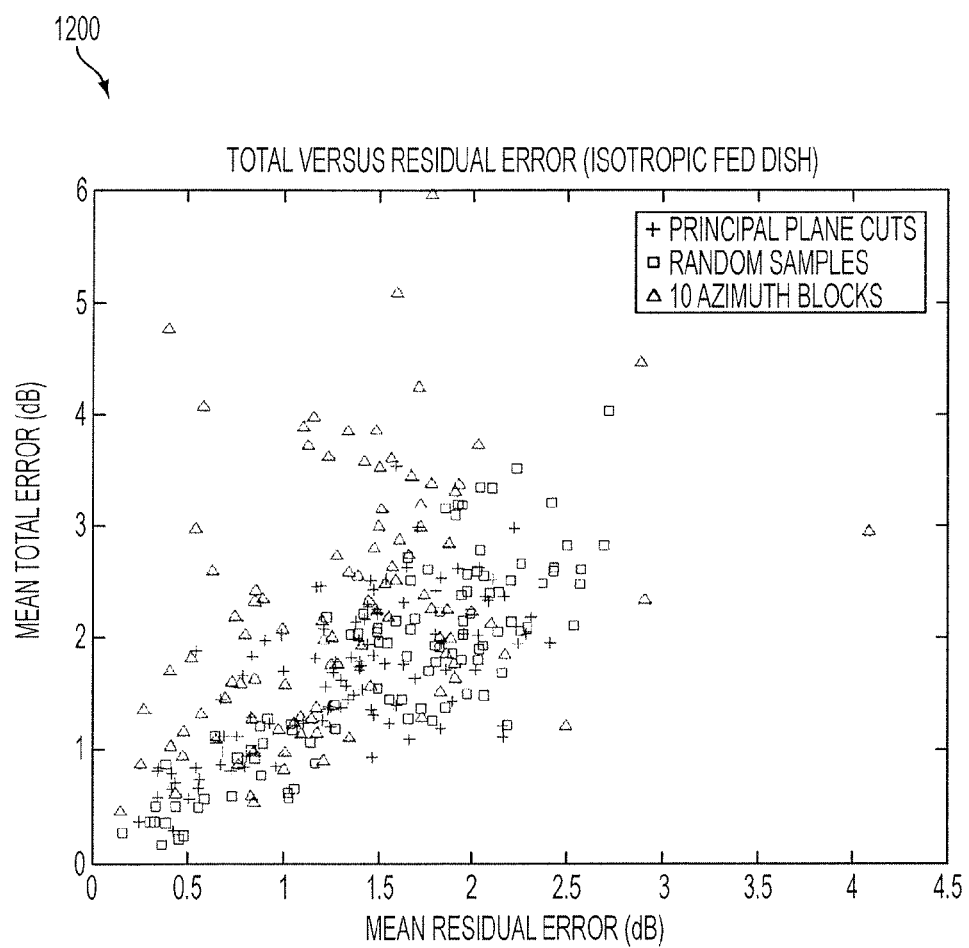
FIG. 12 is a chart illustrating the extrapolation performance for an isotropic fed parabolic dish antenna in accordance with the present invention.

In reference to FIG. 12, a chart illustrating the extrapolation performance for an isotropic fed parabolic dish antenna in accordance with the present invention is disclosed. Dish antennas can be complicated by the fact that the illumination of the dish itself is intimately connected to the feed structure. See FIG. 3 and the explanation of the configuration C provided above. Unlike the case of arrays or horn antennas, no closed form solutions typically exist. Therefore, the computation of F in the TAPE algorithm will usually involve a computational electromagnetics engine. In any case, one needs to make at least 20 measurements to obtain an injective pattern map.

To make this model concrete enough for a computer simulation, the inventor represented the feed as an isotropic radiator. In this simulation, therefore, the SO(3) factor plays no role, and may was removed from C. Indeed, the radiation pattern of the resulting isotropic-fed dish can be found by ray-tracing from the feed to the receiver, reflecting off each of a dense set of points on the reflector. Specifically, the reflector is described by the equation of $y=ax^2+bz^2$. The simulation tested dish antennas having reflector radii up to 6 wavelengths and the feed was located within 6 wavelengths from the vertex of the reflector. The parameters a and b were chosen randomly between 0 and 6. The reflector was simulated with a grid with 20 axial points and 10 radial points. The typical results for 100 dish antennas (10 iterations used in by the TAPE algorithm and controller 100) are shown in FIG. 12. Unlike both horn and rectangular arrays, the performance of dishes is essentially the same regardless of sampling pattern. In particular, random sampling does not outperform other sampling patterns. There are no obvious ambiguities, apparently as the model of the antenna has no symmetries that always are shared by the sampling pattern. The model can be symmetric, but pairs typical antennas will not share axes of symmetry.

The present invention provides, therefore, a system and method for extrapolating antenna radiation patterns from subsampled patterns. The present invention dramatically improves the speed of measurement of full patterns taken from a far-field range, allowing off-cardinal axis sidelobe structure to be estimated indirectly. The present invention exploits the Whitney embedding theorem of differential topology, and is therefore sufficiently general to treat many different kinds of antennas with no change in algorithms. As described above, the system and method of the present invention was validated both experimentally and via simulation.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A system comprising:
a plurality of sensors configured to obtain far-field measurements of an electromagnetic field established by a radiating antenna, the far-field measurements providing a subsampling of a far-field antenna pattern corresponding to the electromagnetic field;
at least one device configured to provide design information substantially corresponding to the radiating antenna, the design information including predetermined physical configuration data and predetermined electrical excitation data;
a controller coupled to the plurality of sensors and the at least one device, the controller being configured to derive an initial data estimate of the radiating antenna pattern based on the design information and compare corresponding portions of the initial data estimate of the radiating antenna pattern to data corresponding to the subsampling of the far-field antenna pattern, the controller being further configured to iteratively obtain at least one intermediate data estimate of the radiating antenna pattern until a final estimate of the radiating antenna pattern is obtained, the at least one intermediate data estimate is identified as the final estimate when a comparison value, based on a difference between the data corresponding to the subsampling of the far-field antenna pattern and the at least one intermediate data estimate of the radiating antenna pattern, is less than a predetermined amount or when a predetermined number of iterations is reached, the controller being further configured to provide extrapolated operational data corresponding to the final data estimate, the extrapolated operational data including extrapolated physical configuration data and extrapolated electrical excitation data substantially corresponding to an operational state of the radiating antenna; and
at least one output device coupled to the controller, the at least one output device being selected from a group of output devices including an antenna calibration unit, an antenna component replacement unit, a display device, or a remote unit accessible via an external network, the at least one output device being configured to perform an antenna related action based on a comparison of the design information and the extrapolated operational data.

2. The system of claim 1, wherein the at least one device is configured to provide the controller with a predetermined sampling pattern corresponding to the subsampling of the antenna pattern.

3. The system of claim 1, wherein the antenna related action provides the display device the extrapolated operational data representing the extrapolated mapping of the antenna pattern.

4. The system of claim 1, wherein the controller is configured to derive an estimate of the physical configuration data and an estimate of the electrical excitation data from the final estimate.

5. The system of claim 4, wherein the antenna related action includes providing the antenna calibration system an antenna calibration action based on the estimate of the electrical excitation data.

6. The system of claim 4, wherein the controller is configured to derive antenna diagnostic data based on the estimate of the physical configuration data.

7. The system of claim 6, wherein the antenna related action is based on the antenna diagnostic data, the antenna related action including a notification to obtain more antenna measurements, an antenna repair action, an antenna component replacement action or a display of the extrapolated mapping.

8. The system of claim 7, wherein the controller provides the antenna diagnostic data to at least one element that is selected from a group of elements that includes a display device, a printing device, a mobile telephone device, a handheld digital assistant device, a network element, an application or a server.

9. The system of claim 1, wherein the controller is coupled to at least one external network via a communication interface, the communications interface being configured to provide a user device coupled to the at least one external network with information corresponding to the far-field measurements, the extrapolated mapping, the estimate of the physical configuration data or the estimate of the electrical excitation data.

10. The system of claim 1, wherein the at least one device includes a remote device coupled to the controller via at least one external network, the controller being configured to receive data and instructions from the remote device.

11. The system of claim 1, wherein the controller is configured to drive the antenna with electrical excitation signals in accordance with the electrical excitation data.

12. The system of claim 1, wherein the design information provided to the controller by the at least one device is randomly derived or supplied by a user.

13. The system of claim 1, wherein the controller is implemented using at least one embedded processor, at least one application specific integrated circuit, or at least one gate array device.

14. The system of claim 1, wherein the measurements of the electromagnetic field include magnitude data, phase data, or polarization data.

15. The system of claim 1, wherein the radiating antenna is selected from a group of radiating antennas including a parabolic dish antenna, a horn antenna, and a phased array antenna.

16. The system of claim 1, wherein the at least one output device is disposed in an antenna repair depot, and the antenna related action provides extrapolated physical configuration data corresponding to an operational status of the radiating antenna.

17. The device of claim 1, wherein the comparison value that substantially corresponds to to $\|P(x_n^j, a_n^j) - p\|$, wherein p represents the data corresponding to the subsampling of the far-field antenna pattern and $P(x_n^j, a_n)$ represents the final data estimate of the radiating antenna pattern.

18. The device of claim 17, wherein $x_n^j$ corresponds to an element of the predetermined physical configuration data and $a_n^j$ corresponds to an element of the predetermined electrical excitation data.

19. The device of claim 1, wherein the difference between the data corresponding to the subsampling of the far-field antenna pattern and the at least one intermediate data estimate of the radiating antenna pattern is minimized using a least squares method.

20. The device of claim 1, wherein the controller executes a recursive algorithm to iteratively obtain the final data estimate.

21. The device of claim 1, wherein the at least one device is selected from a group of devices including a memory device, an external data source, or a remote device coupled to the controller via an external network.

22. A method comprising:
    measuring an electromagnetic field established by a radiating antenna to obtain far-field measurements, the far-field measurements providing a subsampling of a far-field antenna pattern corresponding to the electromagnetic field;
    providing design information corresponding to the radiating antenna, the design information including predetermined physical configuration data and predetermined electrical excitation data;
    deriving an initial data estimate of the radiating antenna pattern based on the design information;
    comparing corresponding portions of the initial data estimate of the radiating antenna pattern to data corresponding to the subsampling of the far-field antenna pattern to obtain a comparison value;
    performing an iterative operation if the comparison value is greater than the predetermined amount, the iterative operation including adjusting at least one intermediate data estimate of the radiating antenna pattern until a final data estimate of the radiating antenna pattern is obtained, the at least one intermediate data estimate being identified as the final estimate when a difference between the data corresponding to the subsampling of the far-field antenna pattern and the at least one intermediate data estimate is less than a predetermined amount, the final data estimate including extrapolated operational data, the extrapolated operational data including extrapolated physical configuration data and extrapolated electrical excitation data substantially corresponding to an operational state of the radiating antenna; and
    performing an antenna related action based a comparison of the design information and the extrapolated operational data.

23. The method of claim 22, wherein the step of performing an antenna related action displays the extrapolated mapping on at least one output device.

24. The method of claim 22, further comprising the step of deriving an estimate of the physical configuration data and an estimate of the electrical excitation data from the final estimate.

25. The method of claim 24, wherein the step of performing an antenna related action includes determining an antenna calibration action based on the estimate of the electrical excitation data.

26. The method of claim 24, wherein the step of performing an antenna related action includes determining an antenna repair action or an antenna component replacement action based on the estimate of the physical configuration data.

27. The method of claim 26, wherein the step of performing an antenna related action includes displaying human readable indicia corresponding to the antenna repair action, the antenna component replacement action or a display of the final estimate of the antenna pattern on at least one output device.

28. The method of claim 22, further comprising the step of providing a device coupled to at least one external network with information corresponding to the far-field measurements, the extrapolated mapping, the estimate of the physical configuration data or the estimate of the electrical excitation data.

29. The method of claim 28, further comprising the step of receiving data and instructions from a device coupled to at least one external network.

30. The method of claim 22, wherein the far-field measurements include magnitude data, phase data, or polarization data.

31. The method of claim 22, wherein the radiating antenna is selected from a group of radiating antennas including a parabolic dish antenna, a horn antenna, and a phased array antenna.

32. The method of claim 22, wherein the antenna related action includes modifying the radiating antenna.

33. The method of claim 22, wherein the comparison value that substantially corresponds to $\|P(x_n^j, a_n^j)-p\|$, wherein p represents the data corresponding to the subsampling of the far-field antenna pattern and $P(x_n^j, a_n^j)$ represents the final data estimate of the radiating antenna pattern.

34. The method of claim 33, wherein $x_n^j$ corresponds to an element of the predetermined physical configuration data and $a_n^j$ corresponds to an element of the predetermined electrical excitation data.

35. The method of claim 22, wherein the difference between the data corresponding to the subsampling of the far-field antenna pattern and the at least one intermediate data estimate of the radiating antenna pattern is minimized using a least squares method.

36. The method of claim 22, wherein the step of performing an iterative operation includes executing a recursive algorithm to obtain the final data estimate.

37. The method of claim 22, wherein the antenna related action is selected from a group of antenna related actions including calibrating the antenna based on the comparison, replacing a component of the antenna based on the comparison, displaying data corresponding to the comparison, the design information or the extrapolated operational data, or providing data corresponding to the comparison, the design information or the extrapolated operational data.

* * * * *